United States Patent [19]
Saitoh et al.

[11] Patent Number: 6,072,948
[45] Date of Patent: Jun. 6, 2000

[54] DEVICE FOR RAPID SIMULATION OF LOGIC CIRCUITS

[75] Inventors: Tetsuo Saitoh, Tokyo; Yuuji Okazaki, Hyogo; Mitsunori Matsunaga; Toshinori Inoshita, both of Tokyo, all of Japan

[73] Assignees: Mitsubishi Electric System LSI Design Corporation, Hyogo; Mitsubishi Denki Kabushiki Kaisha, Tokyo, both of Japan

[21] Appl. No.: 09/017,318

[22] Filed: Feb. 2, 1998

[30] Foreign Application Priority Data

Oct. 22, 1997 [JP] Japan .................................. 9-290170

[51] Int. Cl.[7] ..................................................... G06F 9/455
[52] U.S. Cl. ..................................... 395/500.4; 395/500.35
[58] Field of Search ........................ 395/500.03, 500.02, 395/500.07, 500.12, 500.19, 500.27

[56] References Cited

U.S. PATENT DOCUMENTS

| | | | |
|---|---|---|---|
| 5,084,824 | 1/1992 | Lam et al. | 395/500.12 |
| 5,548,539 | 8/1996 | Vlach et al. | 395/500.27 |
| 5,623,418 | 4/1997 | Rostoker et al. | 395/500.02 |
| 5,802,349 | 9/1998 | Rigg et al. | 395/500.03 |
| 5,867,399 | 2/1999 | Rostoker et al. | 395/500.19 |
| 5,880,967 | 3/1999 | Jyu et al. | 395/500.07 |

*Primary Examiner*—Kevin J. Teska
*Assistant Examiner*—Dan Fiul
*Attorney, Agent, or Firm*—Leydig, Voit & Mayer, Ltd.

[57] ABSTRACT

A logical simulation device has a delay value calculations section to calculate delay values of circuit blocks in a semiconductor integrated circuit as a target of logical simulation based on logical circuit information relating to the logical circuit blocks, input test patterns as operational descriptions of used in circuit verification, and delay value calculation information stored in a delay value and timing check value calculation library, and a logical simulation section performs the logical simulation of the semiconductor integrated circuit based on the calculated delay values.

10 Claims, 13 Drawing Sheets

|  | INPUT PIN A | INPUT PIN B | OUPUT PIN Y | PARAMETERS FOR DELAY CALCULATION |
|---|---|---|---|---|
| CASE (1) | H⇒L | H (FIXED VALUE) | L⇒H | PMOS OPERATION * 2 |
| CASE (2) | L⇒H | H (FIXED VALUE) | H⇒L | NMOS OPERATION * 2 |
| CASE (3) | L⇒H | L (FIXED VALUE) | L⇒H | PMOS OPERATION * 2<br>NMOS OPERATION * 1 |
| CASE (4) | H⇒L | L (FIXED VALUE) | H⇒L | PMOS OPERATION * 1<br>NMOS OPERATION * 2 |

FIG.23

EXAMPLE OF LIBRARY FOR STORING NUMBER OF EVENTS / TEMPERATURE COEFFICIENT CONVERSION PARAMETERS $0 \leq$ NUMBER OF EVENTS$<100$    TEMPERATURE COEFFICIENT t1
$100 \leq$ NUMBER OF EVENTS$<200$    TEMPERATURE COEFFICIENT t2
$200 \leq$ NUMBER OF EVENTS$<300$    TEMPERATURE COEFFICIENT t3
...

FIG.24

BLOCK 12

TEMPTURE : t1'

BLOCK 12a

TEMPTURE : t2'

BLOCK 12b

TEMPTURE : t3'

BLOCK 12c

TEMPTURE : t4'

DEVICE FOR RAPID SIMULATION OF LOGIC CIRCUITS

BACKGROUND OF THE INVENTION

1. Field of the Invention

The present invention relates to a logical simulation device for performing logical simulation of a semiconductor integrated circuit in large scale integration (LSI).

2. Description of the Prior Art

This kind of conventional logical simulation device inputs test patterns as operational descriptions for logical circuit verification and circuit information, including delay characteristic factors between circuit blocks, in a semiconductor integrated circuit as a target of the logical simulation operation, then compares results of the logical simulation operation with expected designed values, and decides the correctness of the logical circuits in the target semiconductor integrated circuit.

In this conventional case, each delay value is calculated using data stored in a library in which delay characteristic factors of each circuit block forming the target semiconductor integrated circuit in the logical simulation are stored. In this conventional method, this calculation of each delay value is performed separately from the logical simulation operation.

FIGS. 1A and 1B are diagram showing the conventional delay value calculation device and the logical simulation device. In FIG. 1A, the reference number 101 designates the conventional delay value calculation device. This conventional delay value calculation device 101 inputs information stored in the memory 102 storing circuit diagrams, information stored in the library 103 storing delay values and timing check values, and back annotation information 104, and then calculates information for the circuit diagrams in the target semiconductor integrated circuit in the logical simulation, delay values required during the logical simulation operation, and the timing check values, and stores calculation results in the file 105. The library 103 stores information of the each of macro cells in the target semiconductor integrated circuit such as minimum units in the circuit, for example, a flip/flop, an OR gate, a AND gate, a NOR gate, a NOT gate, and the like that are provided by ASIC vendor. The reference number 106 designates the logical simulation device. The logical simulation device 106 inputs the circuit diagram information 102 for the target semiconductor integrated circuit in the logical simulation, test patterns as test information, the delay values stored in the file 105 and the timing check values as the calculation results, and then performs the logical simulation using that information, and outputs test results of the logical simulation operation into a test result file 108.

Next, a description will be given of the operation of the conventional delay value calculation device 101.

FIG. 2 is a flow chart showing the operation of the conventional delay value calculation device 101.

In the delay value calculation, first, the delay value calculation device 101 checks delay characteristic factors in circuit blocks such as delay value, wiring capacitance, wiring resistance, and input capacitance of each circuit element in each logical circuit block that affect a signal delay characteristic of each circuit element (Step ST101), and then calculates the basic delay value of each circuit element (Step ST102).

Next, the device 101 compensates the basic delay value by using compensation values of temperature condition, and then calculates the delay value and the timing check value (this timing check value is used only for each of circuits of memory elements such as a latch circuit, a flip flop circuit, and the like) (Step ST103). Then, the delay value calculation device 101 checks whether the calculation has been performed for all macro cells. If YES, the device 101 stops the delay value calculation operation and if NO, the operation of the device 101 returns to the Step ST101 to repeat the above delay value calculation operation.

In this case, it is required to perform the delay value calculation operation for all combinations among input signals. If a macro cell as a target for the delay value calculation operation is a logical sum circuit (an OR gate), delay values for sixteenth combinations of input signals must be calculated as shown in FIG. 3.

That is, when there are ten logical sum circuits in the circuit diagram information that has been given, the delay values must be calculated 160 times (one hundred sixty times, 16×10=160) for all combinations. The delay values for other macro cells such as logical product circuits (AND circuits), flip flops, and the like must also be calculated.

FIG. 4 is a flow chart showing the operation of the delay value calculation executed by the logical simulation device 106 by using the delay values and the timing check values that have been calculated the above calculation operation.

First, the logical simulation device 106 selects macro cells corresponding to inputted test patterns in the circuit diagram information 102, and then obtains input signals through input pins of each selected macro cell (Step ST105).

Next, the logical simulation device 106 performs the timing check operation for those input signals by referring to the delay values and the timing check values at the output pin based on the calculated delay value calculation results (Step ST106) and then outputs the output signal (Step ST107).

For example, in the test pattern of the circuit comprising the logical circuits A, B, and C, as shown in FIG. 5, there are four input signals, input signals a1 and a2 are input to the logical sum circuit A, an output signal from the logical sum circuit A and an input signal a3 are input to the logical sum circuit B, and an output signal from the logical sum circuit B and an input signal a4 are input to the logical sum circuit C.

First, the delay value "01" of the logical sum circuit A is obtained by performing the steps ST101 to 103. After this operation, the operation flow returns to the Step ST101, and the delay value "02" is calculated using the delay result of the logical sum circuit A and the delay value of the logical circuit B.

As the result of the above calculation operations, the total delay value obtained by the logical simulation for the test pattern becomes "01"+"02"+"03".

Because the conventional logical simulation device has the above configuration, the operations of the conventional delay value calculation device and the conventional logical simulation device are performed independently in the development of semiconductor integrated circuits.

For example, because the conventional delay value calculation device calculates delay values of all of elements in the semiconductor integrated circuit without referring to any operational descriptions (as input test patterns) for use in circuit test to be given to the logical simulation operation, there is a waste of operation time and waste of information for the semiconductor integrated circuit.

In addition, more detailed timing check operation requires a tremendous volume of information. Furthermore, because the timing check values stored in a conventional cell library are worst cases for the timing check operation (for example, the same timing check value is stored in the cell library for all macro cells of the same type), an adequate timing margin is required during circuit design of semiconductor integrated circuits. Therefore, it is difficult to perform a high-accuracy timing check operation.

In the conventional logical simulation device, coefficients of the states of logical circuits are designated only for the entire circuit. In addition, because the conventional delay value calculation device 101 performs the delay value calculation using the circuit information stored in the circuit diagram information 102 at the start of the calculation operation, it is difficult to compensate for an error in a delay value caused by a specific operation of the target circuit. That is, an error of the delay value caused by a temperature condition when the logical simulation is executed using the test patterns.

SUMMARY OF THE INVENTION

Accordingly, an object of the present invention is, with due consideration to the drawbacks of the conventional logical simulation device, to provide a logical simulation device reducing the time required to calculate delay values and timing check values of logical circuit blocks and reducing the input information for the calculation by calculating the delay values and the timing check values during the logical simulation operation.

Further, another object of the present invention is to provide a logical simulation device calculating high-accuracy timing check values, that are more accurate than timing check values obtained by the conventional logical simulation device, using little information, namely by using internal node information in macro cells that are primitive circuits. This primitive circuit information is a minimum description unit forming a macro cell described and stored in the cell library.

Moreover, another object of the present invention is to provide a logical simulation device calculating delay values and timing check values more accurately by extracting temperature coefficients corresponding to operational states of target logical circuit blocks during the logical simulation operation, and using the extracted temperature coefficients in the calculation of the delay values and the timing check values.

In accordance with a preferred embodiment of the present invention, a logical simulation device comprises a delay value calculation section for reading logical circuit information including delay characteristic factors between logical circuit blocks in a semiconductor integrated circuit as a target of logical simulation, input test patterns that are descriptions of operation of circuit verification of the logical circuit blocks, and delay value calculation information stored in a delay value and timing check value calculation library, and for calculating delay values of the logical circuit blocks based on the information and the test patterns that are read, and a logical simulation section for performing the logical simulation by using the calculated delay values.

In the logical simulation device as another preferred embodiment of the present invention, the delay value calculation section calculates delay values of conditional passes in which only changes of events are caused by values of the input patterns, and stores the calculated delay values into the delay value and timing check value calculation library.

The logical simulation device as another preferred embodiment of the present invention, further comprises a timing check value calculation section for calculating timing check values based on the calculated delay values, timing check value calculation information read from the delay value and timing check value calculation library.

In the logical simulation device as another preferred embodiment of the present invention, the timing check value calculation section calculates conditional timing check values for the logical circuit blocks in which only changes of events are caused by values of the input patterns other than logical circuit blocks in which no changes of events are caused by values of the input patterns.

In the logical simulation device as another preferred embodiment of the present invention, the timing check value calculation section calculates the timing check values of the logical circuit blocks in consideration to an input through rate obtained by using differences of delay values among passes in each of the logical circuit blocks.

The logical simulation device as another preferred embodiment of the present invention, further comprises a temperature coefficient extracting section for extracting temperature coefficients corresponding to operation states in the logical circuit blocks and for providing the extracted temperature coefficients to the delay value calculation section, wherein the delay value calculation section calculates the delay values in the logical circuit blocks based on the extracted temperature coefficients.

The logical simulation device as another preferred embodiment of the present invention, further comprises a timing check value calculation section for calculating timing check values based on the calculated delay values, timing check value calculation information read from the delay value and timing check value calculation library, wherein the temperature coefficient extracting section extracts the temperature coefficients corresponding to the operation states of the logical circuit blocks and provides the extracted temperature coefficients to the timing check value calculation section, and the timing check value calculation section calculates the timing check values of the circuit blocks based on the extracted temperature coefficients provided from the temperature coefficient extracting section.

The logical simulation device as another preferred embodiment of the present invention further comprises a circuit state/temperature coefficient table for storing temperature coefficients that are optionally set for the circuit blocks and process set values, wherein the temperature coefficient extracting section extracts the temperature coefficients corresponding to the logical circuit blocks from the circuit state/temperature coefficient table in order to use the extracted temperature coefficients preferentially.

In the logical simulation device as another preferred embodiment of the present invention, the temperature coefficient extracting section extracts the temperature coefficients corresponding to the operation states of the logical circuit blocks and provides the extracted temperature coefficients to the delay value calculation section, and the delay value calculation section calculates delay values of the logical circuit blocks based on the provided temperature coefficients.

In the logical simulation device as another preferred embodiment of the present invention, the extracted temperature coefficients are used during a predetermined time period in the logical simulation instead of that the extracted temperature coefficients are stored in the circuit state/temperature coefficient table.

BRIEF DESCRIPTION OF THE DRAWINGS

These and other objects, features, aspects and advantages of the present invention will become more apparent from the following detailed description of the present invention when taken in conjunction with the accompanying drawings, in which:

FIG. 23 is a diagram showing a library for storing event number/temperature coefficient conversion parameters.

FIG. 24 is a diagram showing temperature coefficient conversion parameters extracted from the event number/ temperature coefficient conversion parameter library for logical circuit sections in the logical circuit.

DESCRIPTION OF THE PREFERRED EMBODIMENTS

Other features of this invention will become apparent through the following description of preferred embodiments which are given for illustration of the invention and are not intended to be limiting thereof.

Preferred embodiments of a logical simulation device according to the present invention will now be described with reference to FIG. 6 to FIG. 24.

First embodiment

Figure 1A:
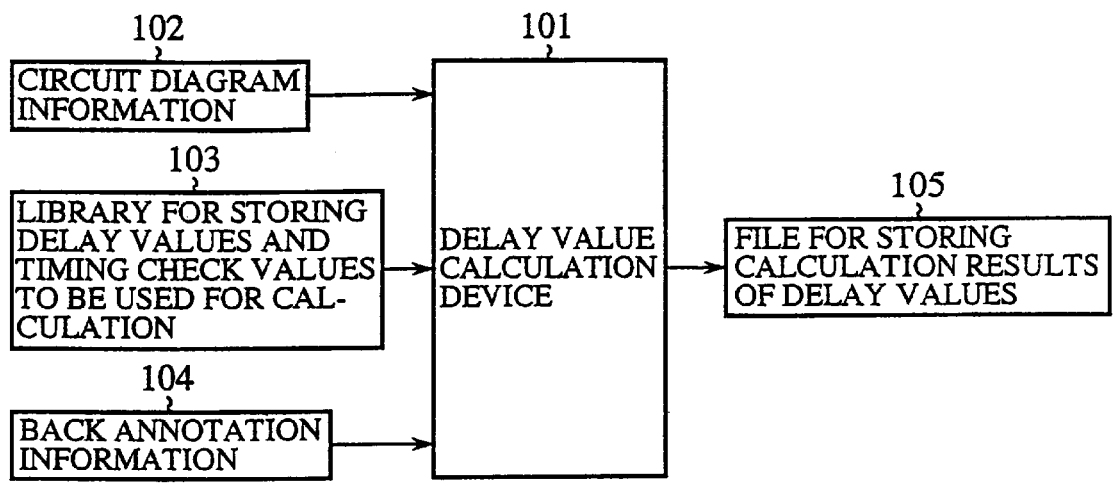
FIGS. 1A and 1B are diagrams showing a configuration of a conventional delay value calculation device and a logical simulation device.
Figure 1B:
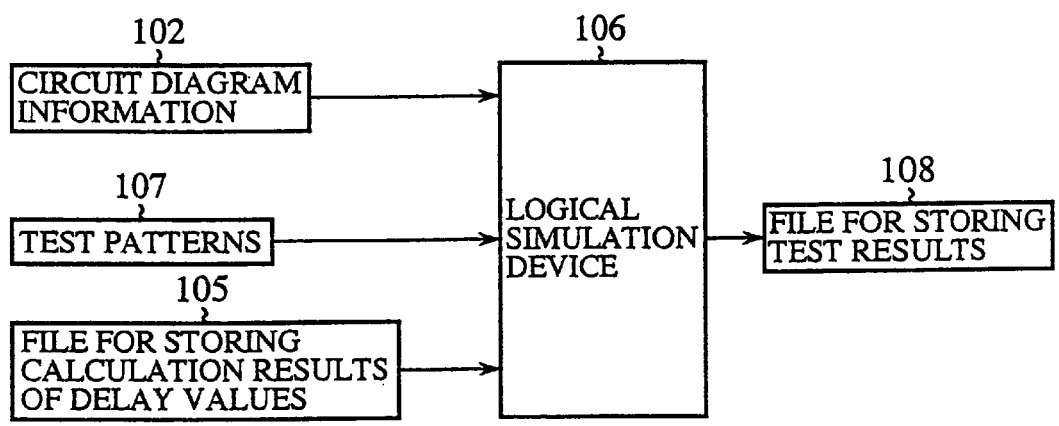
Figure 2:
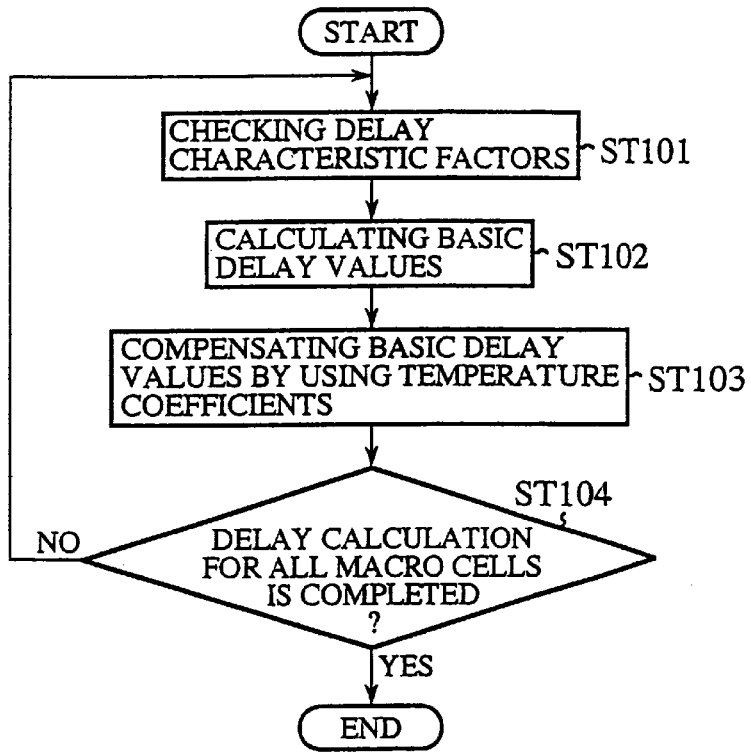
FIG. 2 is a flow chart showing operation of the conventional delay value calculation device.
Figure 3:
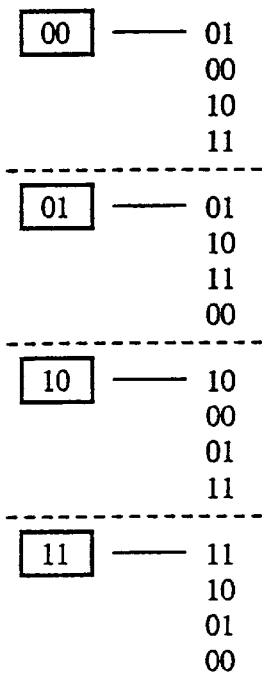
FIG. 3 is a diagram showing combinations of information to be required to calculate delay values for a logical sum circuit as a macro cell.
Figure 4:
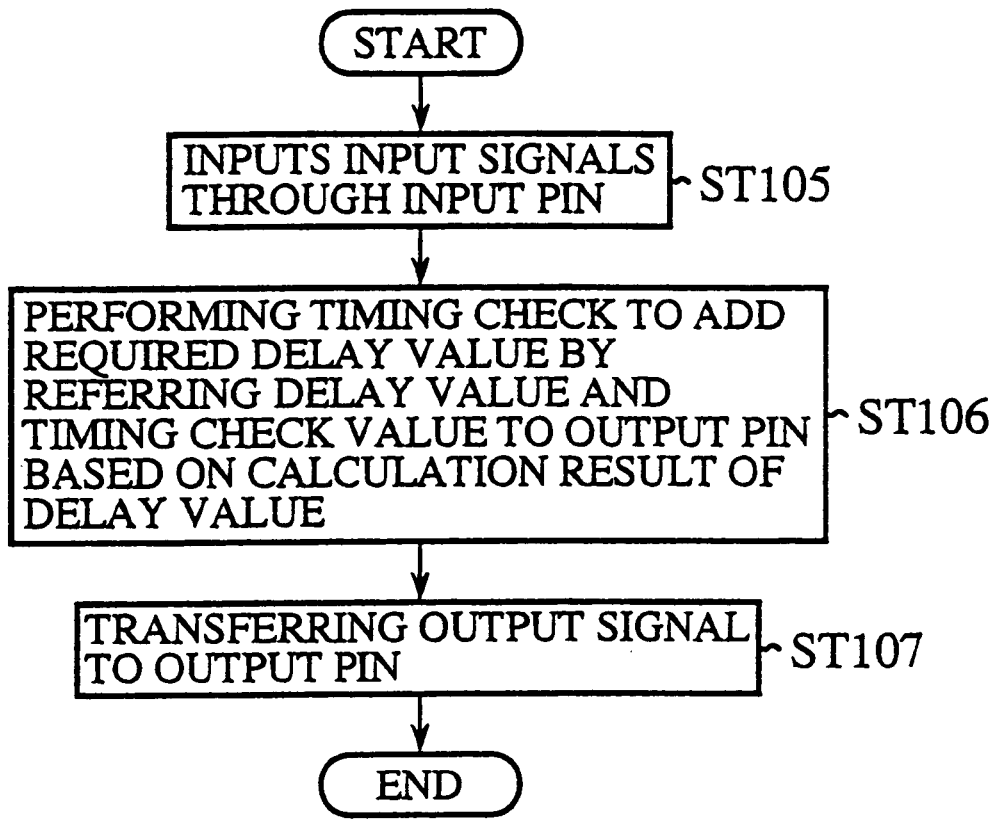
FIG. 4 is a flow chart showing operation of delay value calculation executed by the conventional logical simulation device.
Figure 5:
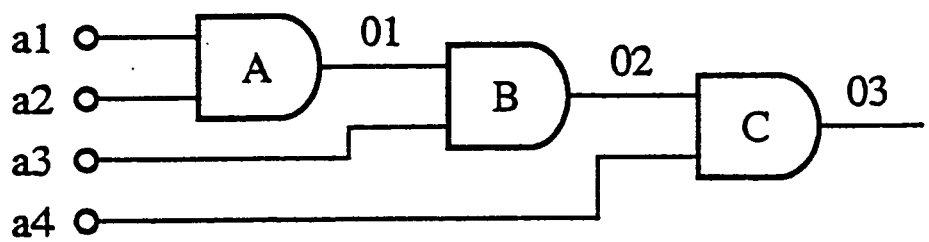
FIG. 5 is a diagram showing test patterns to be used by the conventional delay value calculation device.
Figure 6:
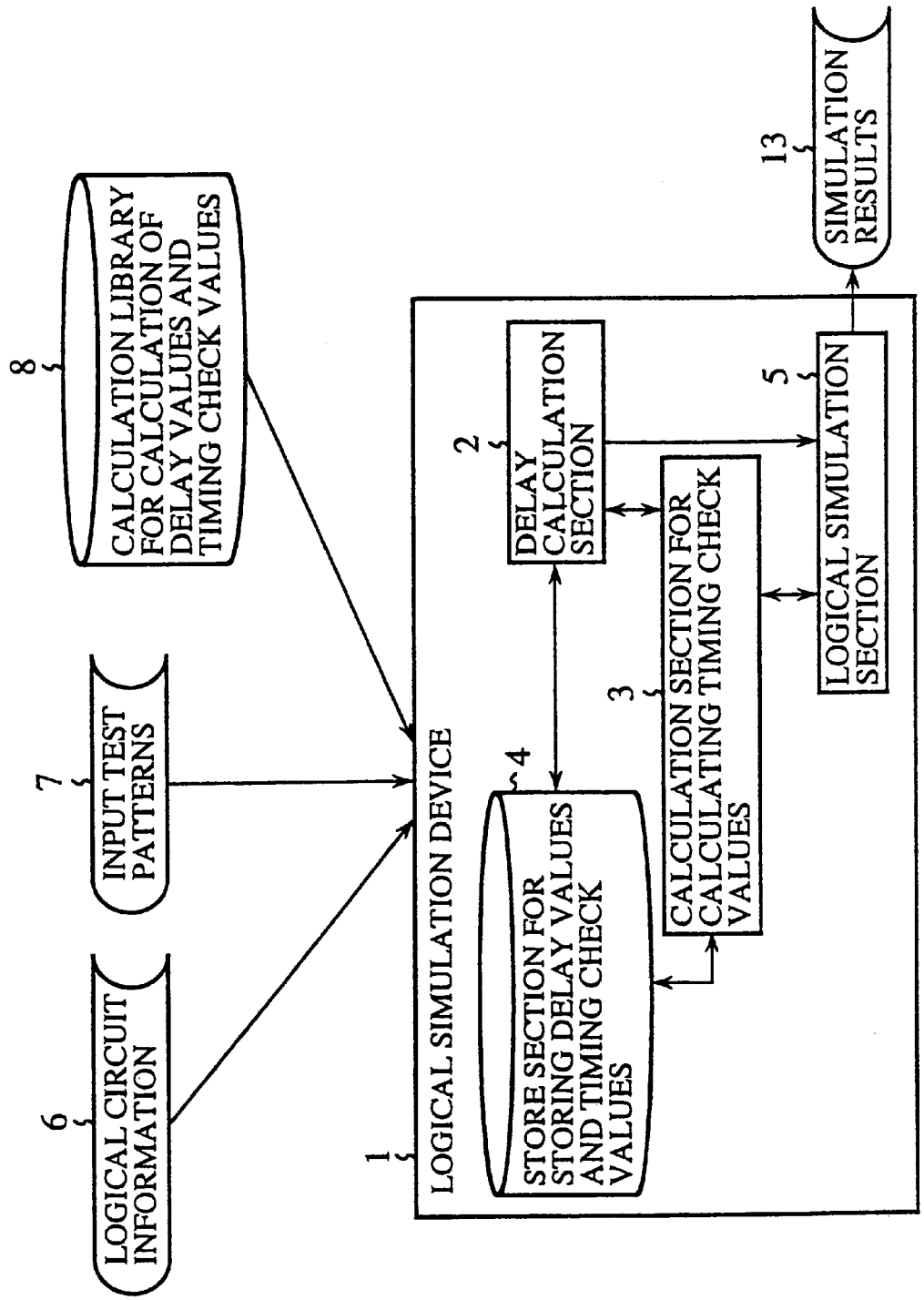
FIG. 6 is a diagram showing a configuration of a logical simulation device as the first embodiment according to the present invention.

FIG. 6 is a diagram showing the configuration of the logical simulation device as the first embodiment according to the present invention.

In FIG. 6, the reference number 1 designates the logical simulation device of the first embodiment comprising a delay value calculation section 2, a timing check value calculation section 3, a store section 4 to store calculated delay values and calculated timing check values, and a logical simulation section 5 for logical simulation based on the results of the calculations.

The reference number 6 denotes logical circuit information including delay characteristic factors of circuit blocks incorporated in a semiconductor integrated circuit, a target of the logical simulation operation.

The reference number 7 designates input test patterns as operational descriptions to be used for circuit verification, and the reference number 8 indicates a library storing timing check values and delay values including delay characteristic factors in each circuit block forming a target circuit for the logical simulation operation.

Next, a description will be given of the operation of the logical simulation device as the first embodiment.

Figure 7:
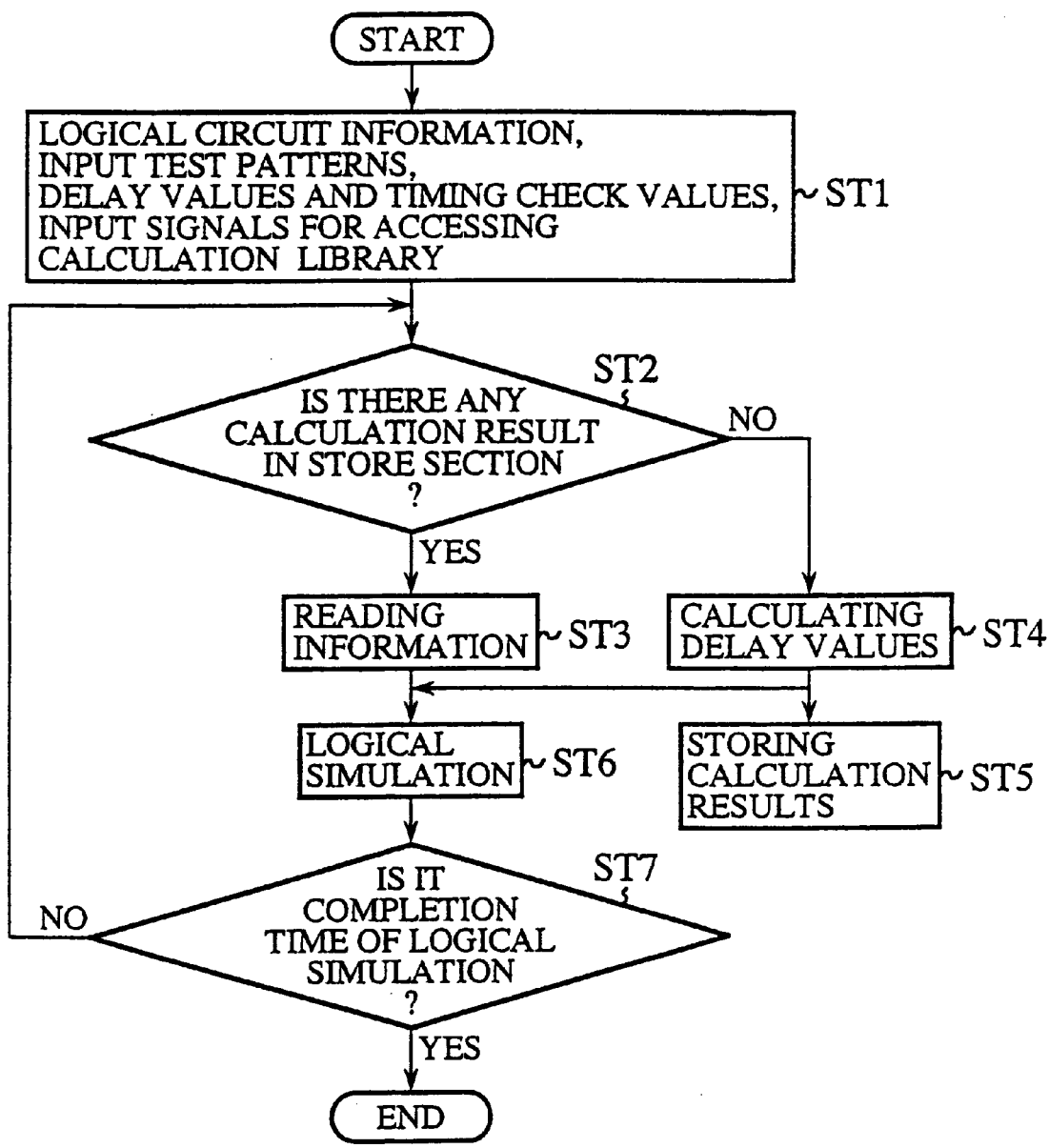
FIG. 7 is a flow chart showing operation of the logical simulation device as the first embodiment shown in FIG. 6.

FIG. 7 is a flow chart showing operation of the logical simulation device as the first embodiment shown in FIG. 6.

First, the logical simulation device 1 inputs the logical circuit information 6, the input test patterns 7, and the information read from the library 8 for storing delay values and timing check values (Step ST1).

Next, the logical simulation device 1 checks whether or not there is any calculation result corresponding to logical circuit blocks in the store section 4 for storing delay values and timing check values (Step ST2). When YES, namely when there is a calculation result in the delay value and timing check store section 4, the logical simulation device 1 reads the information from the delay value and timing check value store section 4 (Step ST3). On the other hand, when NO, namely when there is no calculation result in the store section 4, the delay value calculation section 2 and the timing check value calculation section 3 in the logical simulation device 1 calculate delay values and timing check values, respectively, based on the inputted information described above, the logical circuit information 6, the input test patterns 7, and the data items stored in the library 8 to be used for the calculation of the delay values and timing check values (step ST4). Then both section 2 and 3 output calculation results into the delay value and timing check value store section 4 (Step ST5).

The logical simulation section 5 then performs the logical simulation operation using the calculated delay values and the timing check values, and outputs a simulation result 13. Further, the logical simulation device 1 checks whether or not the logical simulation time has reached the completion time for the logical simulation operation (Step ST7). If NO, the operation flow returns to the Step ST2. If YES, the logical simulation operation finishes.

In the above explanation, both the delay values and the timing check values are calculated for latch circuits, flip flop circuits (F/F circuits), and the like. The timing check values are calculated only for the latch circuits, the flip flop circuits, and like elements having a memory function. The delay values are calculated for all circuits.

Figure 8:
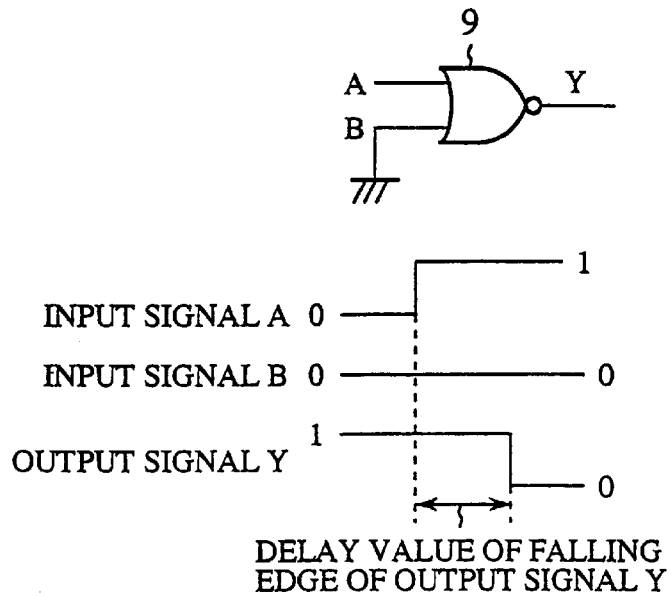
FIG. 8 is a circuit diagram of a logical NOR element to be used for explanation of the delay value calculation.

FIG. 8 is a circuit diagram of a logical NOR element to be used for explanation of the delay value calculation.

In FIG. 8, the input pin B inputs the constant data item of zero, and the input pin A inputs test data items. The level of each test data item is always switched from a low level to a high level. In the test patterns shown in FIG. 8, the output signal at the output pin is only changed from the high level to the low level. Therefore only the delay value at the falling edge of the output signal is calculated during the logical simulation operation. In this case, the delay value calculation is halved. In addition, when the delay value for the same instance is calculated, the delay value and the timing check value that have already been calculated may be read from the delay value and timing check value store section 4. This technical term "instance" means the identification name of a macro cell in the target circuit for the logical simulation. That is, because a plurality of macro cells having the same configuration are used in the target circuits during the logical simulation, those macro cells must be indicated using different identification names.

As described above, according to the logical simulation device 1 of the first embodiment, because the logical simulation device 1 calculates both the delay values and the timing check values, it is possible to eliminate the calculation for any event caused by certain of the input test patterns 7 (for example, an event is the change of the level of the output signal Y by the change of the input signal A or the input signal B as shown in FIG. 8), so that it is possible to reduce the number of input data items during the logical simulation operation. That is, by calculating the delay values based on the input test patterns 7, only delay values required during the logical simulation operation are calculated, so it is possible to reduce undesired information, the calculation time length, the number of data items to be stored in the libraries.

Second embodiment

Figure 9:
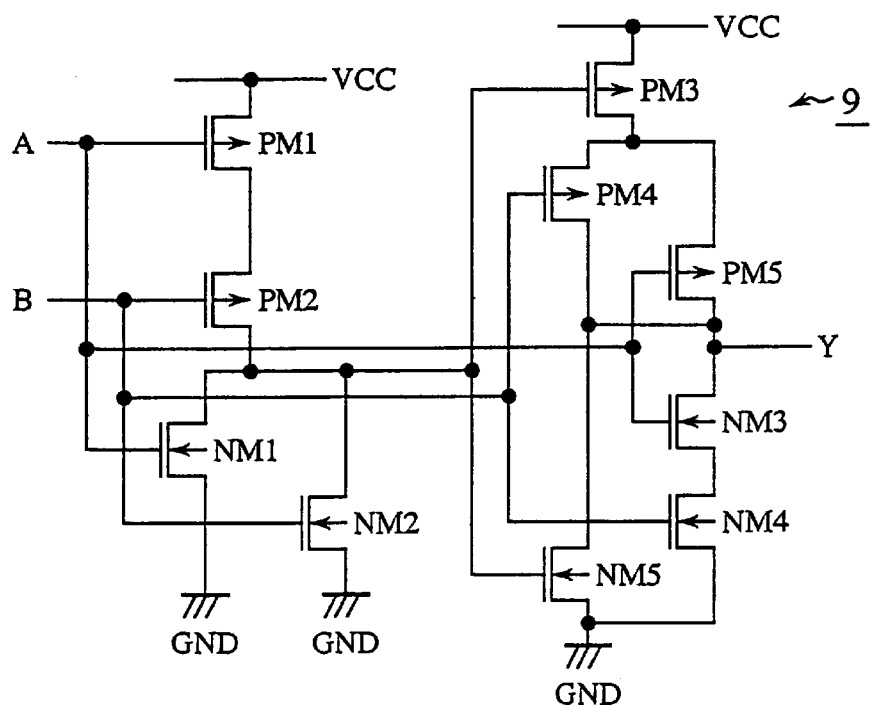
FIG. 9 is a diagram showing a transistor circuit to be used by a logical simulation device as the second embodiment according to the present invention.

FIG. 9 is a diagram showing a transistor circuit to be used by the logical simulation device as the second embodiment according to the present invention.

The logical simulation device of the second embodiment eliminate the calculation for cases in which no event happens, using the states of input test patterns and delay values (these are called "conditional pass delay values") from input pins to output pins in a macro cell which are different from each other, according to the states of levels of the input signals. FIG. 9 shows the logical element XOR (or XOR circuit) 9 as one example.

First, a description will now be given of the explanation of the conditional pass delay by referring to the XOR circuit 9 shown in FIG. 9.

Figures 10, 11:
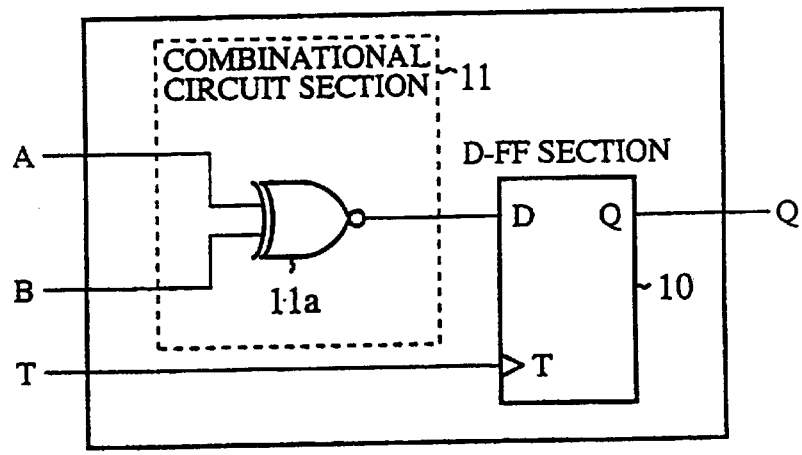
FIG. 10 is a diagram showing data items stored in a library in which the data items to be used for calculating delay values and timing check values are stored.
FIG. 11 is a circuit diagram showing a macro cell connected to a combination circuit section to be used in a logical simulation performed by a logical simulation device as the third embodiment according to the present invention.

Like the explanation of the logical simulation device 1 of the first embodiment shown in FIG. 6, the changing speed of each state of the output pin has a different value according to the level of the input signal. As shown in FIG. 10, the delay value in the XOR circuit 9 depends on not only the signal level at the input pin A, but also the signal level of the input pin B. This is called "conditional pass delay".

FIG. 10 is a diagram showing data items stored in the libraries 6, 7, and 8 in which the data items to be used for calculating the delay values and timing check values are stored. The logical simulation device according to the second embodiment calculates the delay values for the cases (1) and (2) in the table shown in FIG. 10 when the input pin B in the XOR circuit 9 shown in FIG. 9 inputs only the input pattern of the fixed high level.

The logical simulation device of the second embodiment stores the calculation result in the store section 4, like the logical simulation device 1 of the first embodiment. After this calculation and storing, the logical simulation device of the second embodiment reads the calculation results stored in the store section 4 in which the delay value obtained by the previous calculation process is stored and, when the delay value of a same instance is required, the timing check value.

As described above, according to the logical simulation device of the second embodiment, it is possible to eliminate the calculation operation for the delay value for the pass in which no event is changed. It is thereby possible to reduce the number of data items to be provided to the logical simulation device and possible to reduce unnecessary calculations and to decrease the time length of the delay value calculation when compared with the conventional delay value calculation in which delay values for all of the cases (1) to (4) shown in FIG. 10 must be calculated.

Third embodiment

FIG. 11 is a circuit diagram showing a macro cell connected to a combinational combination circuit section to be used in a logical simulation performed by the logical simulation device as the third embodiment according to the present invention. That is, FIG. 11 is used for the calculation of the explanation of the conditional pass timing check value executed by the logical simulation device of the third embodiment. The conditional pass timing check value means that the delay values from the input pins of a macro cell to the output pin of the macro cell have different values according to the states of the levels of input signals to the macro cell.

The calculation of the timing check value for the macro cell shown in FIG. 11 is the calculation of a hold value and a setup value performed using the Double flip flop (D-FF) section 10.

However, there is a combinational circuit section 11 in a previous stage that is connected to the internal pin D of the D-FF section 10. It is therefore required to calculate the timing check value of the macro cell shown in FIG. 11 in consideration of a delay value in the combinational circuit section 11. In this case, because there is a X-NOR circuit 11a in the combinational circuit section 11, the signal transfer speeds between the input pins A and B and the internal pin D in the D-FF section 10 are different, respectively. Therefore, the timing check values between the input pin A to the internal pin D and between the input pin B to the internal pin D are different, respectively based on the state of each of the input pins A and B.

Thus, when the timing check value for a macro cell is calculated, there are sixteen combinations for the states of input signals. Therefore, it is required to calculate the timing check value sixteen times. However, because the logical simulation device of the third embodiment references the test patterns during the logical simulation and can calculate timing check values only for necessary combinations, it is possible to reduce the time length required for the logical simulation.

As described above, according to the logical simulation device of the third embodiment, the delay values and the timing check values for macro cells are calculated during the logical simulation and it is possible to eliminate the calculation of the timing check value for macro cells in which there are no change of events based on input test patterns.

Fourth embodiment

The logical simulation device of the fourth embodiment will be explained with reference to FIGS. 12 to 18.

In the following explanation, the logical simulation device of the fourth embodiment extracts macro cells as target circuits of the logical simulation, calculates the delay value of each extracted macro cell, and then calculates a timing check value of each extracted macro cell in consideration to an input through rate obtained by differences among internal delay values obtained in each of the macro cells. This input through rate is an inclination of a voltage when Time is the horizontal axis and Voltage is the vertical axis.

Figure 12:
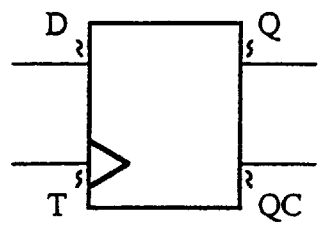
FIG. 12 is a diagram showing a macro cell as a target of the logical simulation performed by a logical simulation device as the fourth embodiment according to the present invention.
Figure 14:
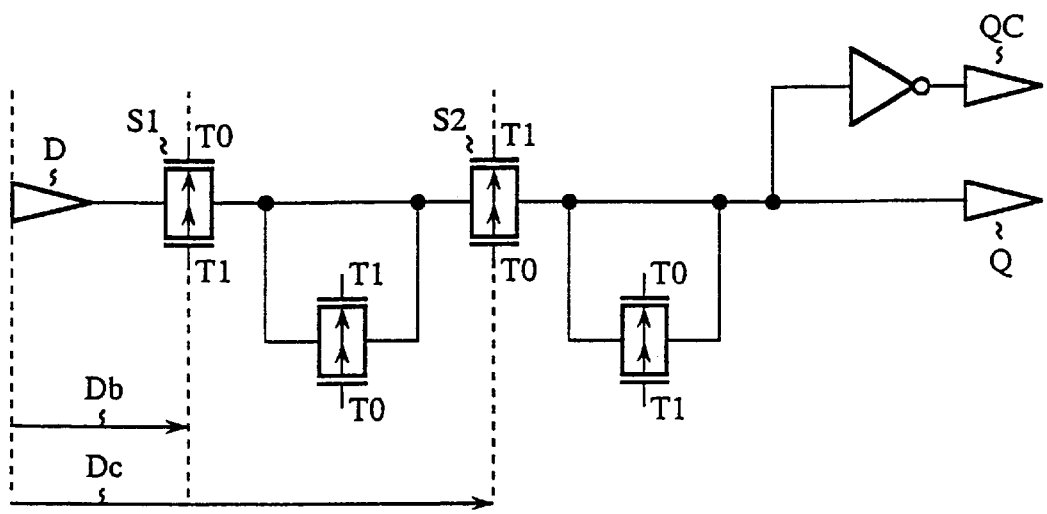
FIG. 14 is a diagram showing an internal configuration of the macro cell.

FIG. 12 is a diagram showing a macro cell as a target of the logical simulation performed by the logical simulation device as the fourth embodiment according to the present invention. First, as shown in FIG. 12, the macro cell (for example, a Dflip/flop (D-FF) circuit) as a target of the logical simulation is extracted. FIGS. 12 and 14 show the configuration of the D-FF circuit.

Figure 13:
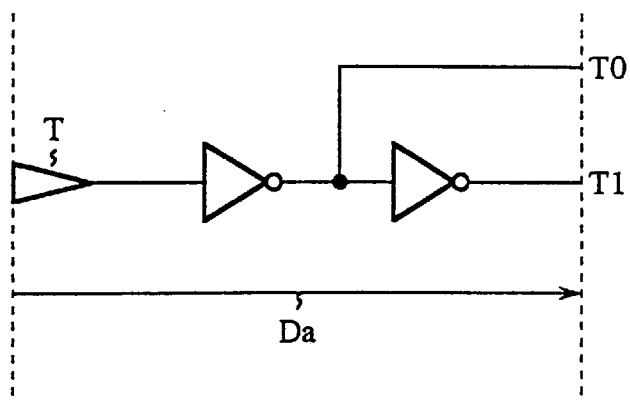
FIG. 13 is a diagram showing an internal configuration of the macro cell.

FIG. 13 is a diagram showing an internal configuration of the D-FF circuit as the macro cell in which the passes from the input pin T to the switching gates T0 and T1 are shown. The reference character Da indicates a delay time of a signal transmission from the input pin T to the switching gate T0 or T1.

FIG. 14 is a diagram showing an internal configuration of the D-FF circuit as the macro cell in which the passes from the input D to the output pins Q and QC through the switching gates T0 and T1 are shown. The reference character Db designates a delay time of a signal transmission from the input pin D to the switching gate S1. The reference character Dc designates a delay time of a signal transmission from the input pin D to the switching gate S2.

Next, the timing check value (for example, set-up time, and hold time) of the macro cell shown in FIG. 12 is extracted.

Figure 15:
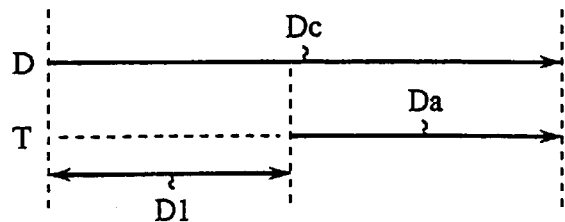
FIG. 15 is a diagram showing a relationship between the extracted delay values and the timing check value in the set-up time.

FIG. 15 is a diagram showing a relationship between the extracted delay values and the timing check value to the set-up time. The reference character Dc shown in FIG. 15 denotes the delay time of a signal transmission from the input pin D shown in FIG. 14 to the switching gate S2. The reference character Da shown in FIG. 15 denotes the delay time of a signal transmission from the input pin T shown in FIG. 13 through the switching gates T0 and T1. The reference character D1 shown in FIG. 15 indicates the check value of the set-up time obtained by using the delay times Da and Dc.

Figure 16:
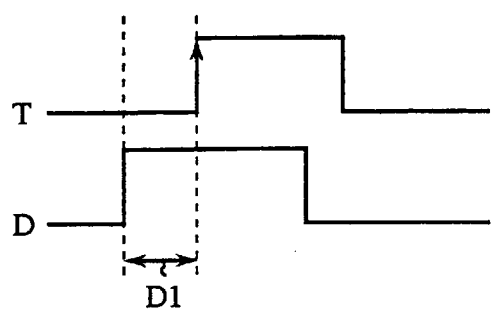
FIG. 16 is a timing chart of signal levels at both the input pin T and the input pin D.

FIG. 16 is a timing chart of signal levels at both the input pin T and the input pin D. The reference character D1 designates the timing check value of the set-up time shown in FIG. 15.

Figure 17:
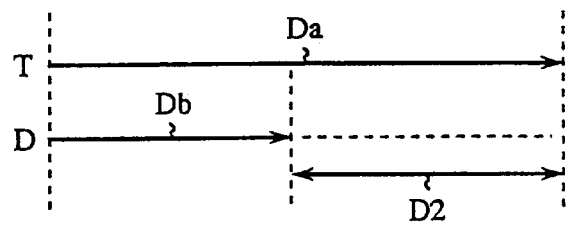
FIG. 17 is a diagram showing a relationship between the delay value and the timing check value of a hold time.

FIG. 17 is a diagram showing a relationship between the delay time values shown in FIGS. 13 and 14 and the check value of the hold time. The reference character Db designates the delay time from the input pin D to the switching gate S1 shown in FIG. 14, the reference character Da denotes the delay times from the input pin T through the switching gates T0 and T1 shown in FIG. 13, and the reference character D2 indicates the check value of the hold time obtained from the delay values Da and Db.

Figure 18:
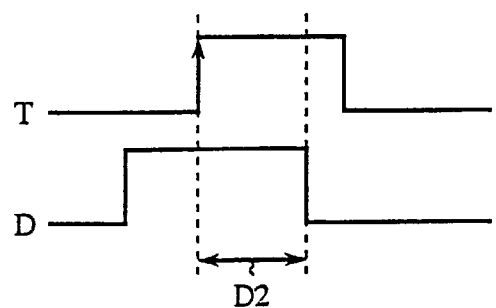
FIG. 18 is a timing chart of levels of both input pins T and D.

FIG. 18 is a timing chart of levels of both the input pins T and D. The reference character D2 indicates the check value of the hold time obtained from the delay values Da and Db. Delay value calculation information for use in the calculation of the internal delay values in the macro cell is the same as those in the first embodiment. For example, in a case where the signal state of the input pin D is inputted at the rising edge of the signal at the input pin T, because the set-up time may be inputted only from the time when the signal of the input pin D enters the stable state until the time in which the signal level of the input pin T changes from the low level to the high level and the signal is transferred to the switching gates T0 and T1, the logical simulation device of the fourth embodiment uses the timing check value extracted by the logical simulation, while considering the delay time from each input pin. The time obtained by subtracting the delay time Db of the input pin D to the switching gate S2 from the delay time Da of the input pin T through the switching gates T0 and T1 is extracted as the timing check value D1 of the set-up time of the macro cell, and then the timing check operation is executed by using this timing check value extracted during the logical simulation.

In addition, because the correct signal value may be inputted only from the time when the signal of the input pin D enters the stable state, in which the signal level of the input pin D is not changed, until the time in which the signal level of the input pin T is changed from the low level to the high level and the signal is transferred to the switching gates T0 and T1, the logical simulation device of the fourth embodiment uses the timing check value D2 extracted by the logical simulation, while considering to the delay time from each input pin. The time obtained by subtracting the delay time Da from the input pin T through the switching gates T0, T1 from the delay time Db of the input pin D to the switching gate S1 is extracted as the timing check value D2 of the hold time of the macro cell. This extracted timing check value D2 is used as the timing check value to be verified in the logical simulation.

As described above, according to the logical simulation device of the fourth embodiment, because the timing check value of the macro cell as a target of the timing check operation is obtained based on the delay values obtained by the delay value calculation, it is possible to perform the detailed timing check operation depending on the transition states, input through rates, combinations of levels of input pins, and the like.

Fifth embodiment

In the logical simulation device of the fifth embodiment, temperature and process variation coefficients are set for optional circuit sections in logical circuit blocks as targets of the logical simulation operation and the logical simulation operation is performed by considering to the information of those temperature and the process variation coefficients.

Figure 19:
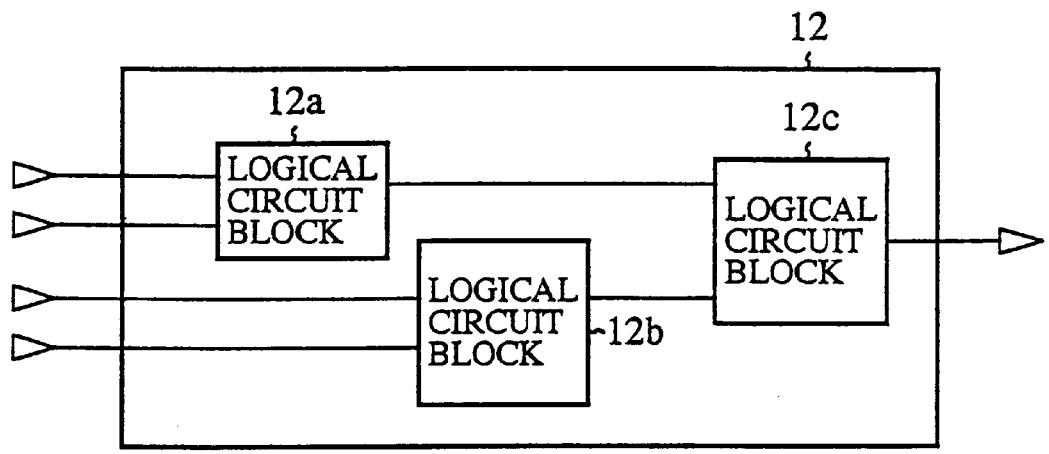
FIG. 19 shows a logical circuit block as a target of the logical simulation performed by the logical simulation device as the fifth embodiment according to the present invention.

FIG. 19 shows a logical circuit block as a target of the logical simulation performed by the logical simulation device as the fifth embodiment according to the present invention. In FIG. 19, the logical circuit block 12 comprises logical circuit blocks 12a, 12b, and 12c.

Figure 20:
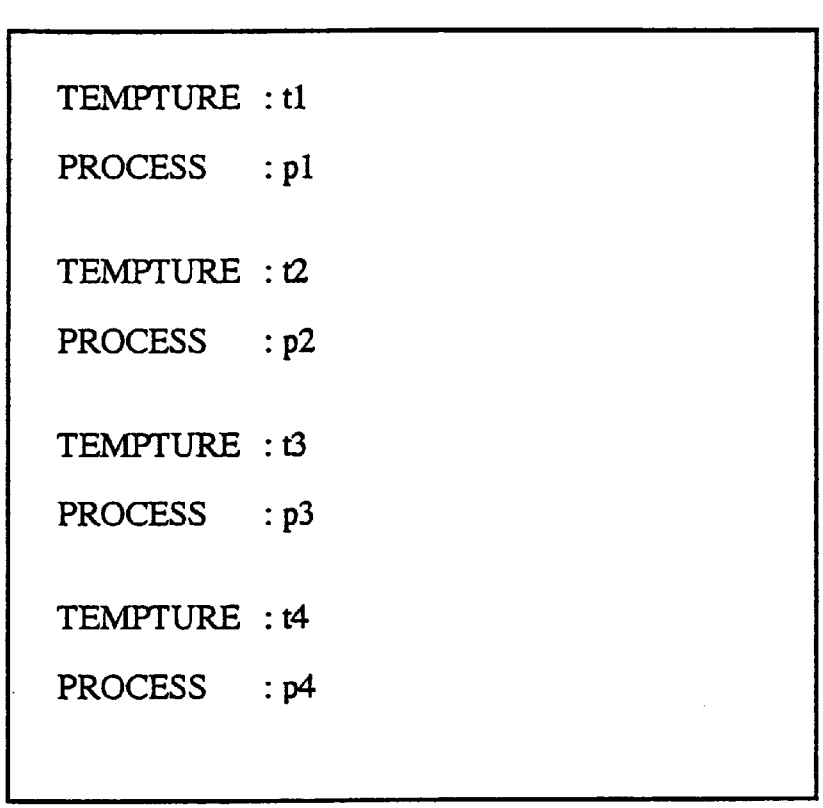
FIG. 20 is a diagram showing an example of temperature coefficients to be used for a logical circuit.

FIG. 20 is a diagram showing an example of temperature coefficients to be used for the logical circuit blocks 12a, 12b, and 12c forming the logical circuit block 12.

First, the logical circuit block as the target of the logical simulation is extracted from each information for a semiconductor integrated circuit to be designed.

Information about optimum temperatures and optimum process variation coefficients for each of the logical circuit blocks 12a, 12b, and 12c are prepared in advance. Then, the optimum temperatures and the optimum process variation coefficients are set for each of the logical circuits 12a, 12b, and 12c.

When there is no temperature coefficient and no process variation coefficient for the logical circuit block 12b, coefficient the logical simulation device of the fifth embodiment performs the calculation of the delay values and the logical simulation for the logical circuit block 12 using the functions of the logical simulation device of the fifth embodiment that are equal to the functions of the logical simulation devices of the first to fourth embodiments after the temperature information and the process variation information for the block 12a that is in an upper stage of the block 12 have been set for the block 12b.

As described above, according to the logical simulation device of the fifth embodiment, it is possible to perform the delay value calculation and the logical simulation with high accuracy for target logical circuits of the logical simulation by setting temperature coefficients and process variation coefficients to optional circuit sections in the target logical circuits.

Sixth embodiment

Figure 21:
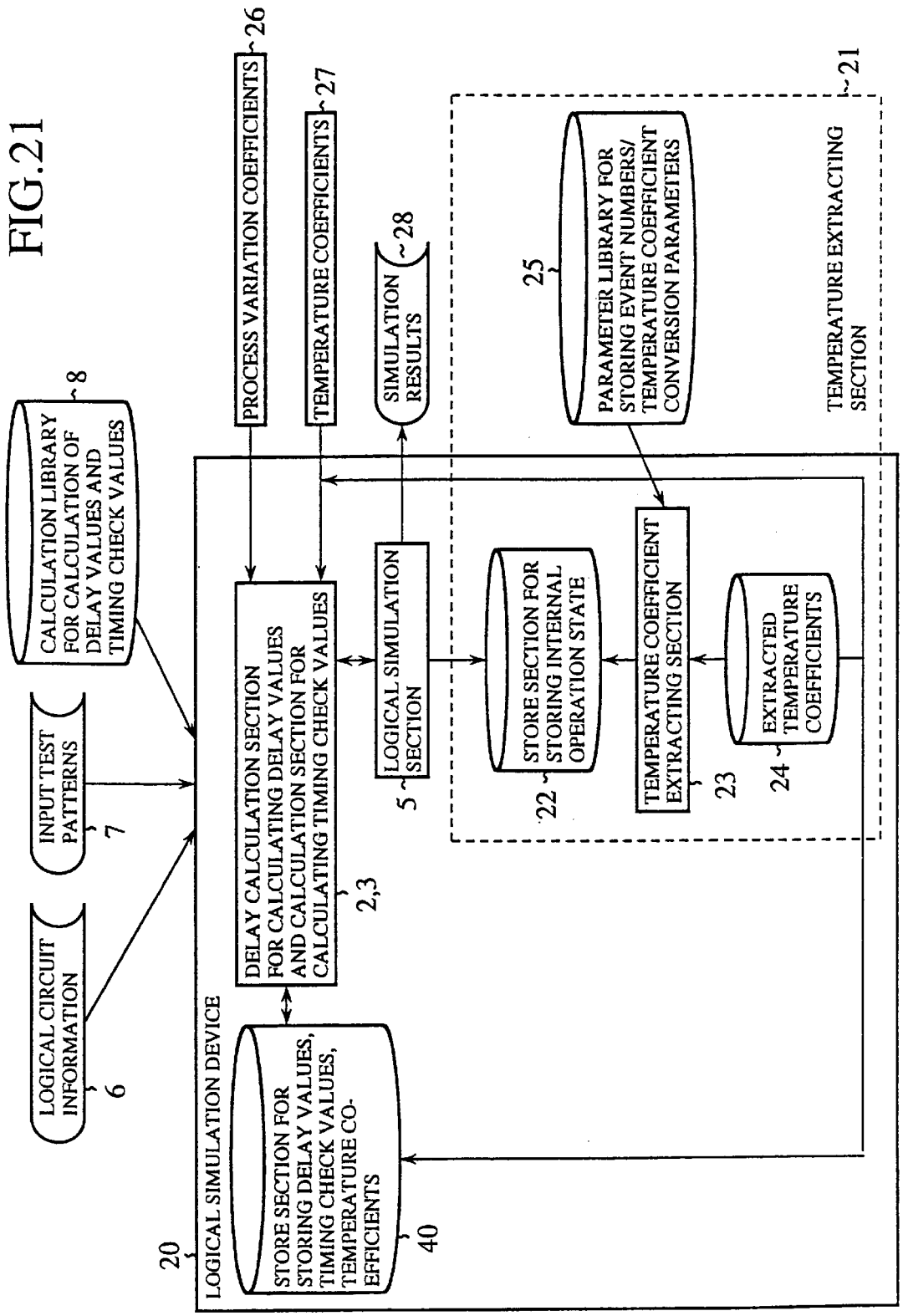
FIG. 21 is a block diagram showing a logical simulation device as the sixth embodiment according to the present invention.

FIG. 21 is a block diagram showing the logical simulation device 20 as the sixth embodiment according to the present invention.

In FIG. 21, the reference number 21 designates a temperature extracting section comprising a store section 22 for storing internal operation states, a temperature coefficient extracting section 23, a file 24 for storing extracted temperature coefficients, and a library 25 for storing event number/temperature coefficient conversion parameters. Other components in the logical simulation device 20 of the sixth embodiment shown in FIG. 21 that are equal in configuration and function to the components in the logical simulation device 1 of the first embodiment shown in FIG. 6 are shown using the same reference numbers and the explanation of the same components is therefore omitted for brevity.

Next, a description will be given of the operation of the logical simulation device 20 of the sixth embodiment.

Figure 22:
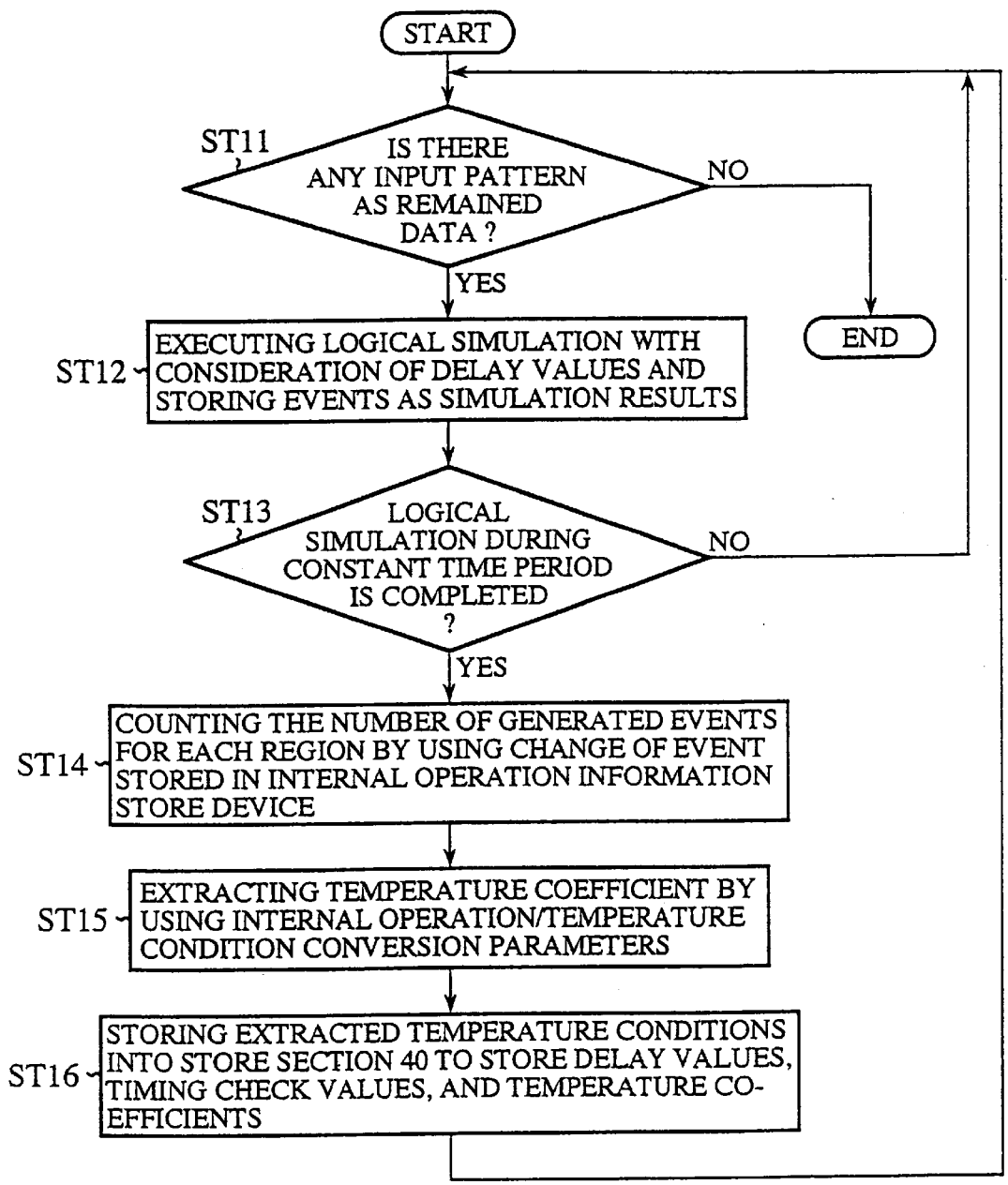
FIG. 22 is a flow chart of operation of the logical simulation device as the sixth embodiment.

FIG. 22 is a flow chart showing the operation of the logical simulation device 20 as the sixth embodiment.

First, at the Step ST11, it is checked whether or not there are test patterns for which the logical simulation is not performed in the input test patterns 7. When the logical simulation has been performed for all of the input test patterns 7, the operation flow of the logical simulation becomes completed.

When there are test patterns for which the logical simulation is not performed in the input test patterns 7, at the Step ST12, the calculation of delay values are performed by using the information read from the library 8 for storing information to be used for calculation of delay values and timing check values, process variation coefficients 26, and temperature coefficients 27. Further, the timing check value calculation section 3 calculates timing check values. After this, the logical simulation section 5 performs the logical simulation using the calculation results described above.

The logical simulation device 20 of the sixth embodiment outputs the logical simulation results 28 and stores events based on the logical simulation results in the internal operation state store section 22.

At the Step ST14, it is checked whether or not the execution of the logical simulation during a desired time period has been elapsed. This desired time period is set optionally.

When the execution of the logical simulation during the desired time period has not been completed, the operation flow returns to the step ST11. Following this operation, the logical simulation for each of the following input patterns is repeated until the desired time period will be elapsed.

When the execution of the logical simulation in the desired time period is completed, the number of the events stored in the internal operation state store section 22 is counted per each section at the Step ST14. In the following step ST15, the temperature coefficient extracting section 23 extracts the temperature coefficient 24 by referring to the event count, the number of events, event number/temperature coefficient conversion parameter library 25 for each section. Then, at the Step ST16, the extracted coefficient 24 is stored in the store section 40 and also provided to both the delay value calculation section 2 and the timing check value calculation section 3.

FIG. 23 shows an example of the information stored in the event number/temperature coefficient conversion parameter library 25.

In the conventional logical simulation device, only one temperature coefficient is designated for the entire circuit as a target of the logical simulation.

Hereinafter, the calculation method of the delay value executed in the conventional logical simulation device in consideration of the temperature coefficient is shown:

Delay value in consideration of the temperature coefficient=delay value×condition coefficient, and Condition coefficient=temperature coefficient×process variation coefficient.

The logical simulation device 20 of the sixth embodiment can designate each parameter in each optional circuit section in order to increase the accuracy of the delay value. For example, the following equations show the calculation method of the delay value in consideration of conditions to the event in the logical circuit block 12a:

Delay value in consideration of a temperature coefficient to an event caused in the logical circuit block 12a=delay value×condition coefficient of the logical circuit block 12a, and Condition coefficient of the logical circuit block 12a=temperature coefficient of the logical circuit block 12a×process variation coefficient of the logical circuit block 12a.

Hereinafter, a specific temperature coefficient extracting method executed by the logical simulation device 20 of the sixth embodiment will be explained.

First, both the logical simulation and the delay value calculation are performed simultaneously. At this time, it is acceptable to use values of the temperature coefficients and the process variation coefficients for the entire of the logical circuit or optional section in the logical circuit that are supplied externally by users.

Next, when any change of an event happens as the result of the logical simulation, the number of changes of the event is stored into the internal operation state store section 22.

After the logical simulation for all of the test patterns is completed, the total number of changes of the events stored in the internal operation state store section 22 is counted. The temperature coefficient extracting section 23 extracts a new temperature coefficient based on the total number of changes of the events stored in the internal operation state store section 22 and the information stored in the event number/temperature coefficient conversion parameter library 25. For example, when the total number of changes of the events is 150 and when data items stored in the event number/temperature coefficient conversion parameter library 25 shown in FIG. 23 are given, the new extracted temperature coefficient is the value t2.

Seventh embodiment

The seventh embodiment of the present invention shows a logical simulation device that is capable of calculating the delay value again by using the extracted temperature coefficient.

The logical simulation device of the fifth embodiment performs the delay value calculation and the logical simulation using temperature coefficients that have been estimated in advance. On the other hand, the logical simulation device of the seventh embodiment performs the delay value calculation and the logical simulation by using the temperature coefficients, that have extracted by the logical simulation device 20 of the sixth embodiment, instead of the above temperature coefficients to be used by the logical simulation device of the fifth embodiment.

When the temperature coefficients extracted at the Step ST16 are stored, information indicating the relationship between a temperature coefficient and an event of a logical simulation result for a circuit section corresponding to the temperature coefficient that has been used for the logical simulation of the circuit section is also stored.

FIG. 24 is a diagram showing temperature coefficient conversion parameters extracted from the event number/temperature coefficient conversion parameter library 25 for logical circuit sections 12*a*, 12*b*, 12*c* in the logical circuit 12.

The logical simulation device of the seventh embodiment may refer to the parameters stored in the event number/temperature coefficient conversion parameter library 25 prior to the data items stored in the library shown in FIG. 20, so it is possible to perform the delay value calculation and the logical simulation with high accuracy when compared with the logical simulation device of the fifth embodiment.
Eighth embodiment In the logical simulation device of each of the sixth embodiment and the seventh embodiment described above, extracted temperature coefficients are stored in the event number/temperature coefficient conversion parameter library 25 and are read again during following logical simulation operation. Conversely, the logical simulation device of the eighth embodiment uses the extracted temperature coefficients in following logical simulation only during a predetermined time period instead of those temperature coefficients stored into the event number/temperature coefficient conversion parameter library 25. It is thereby possible to execute a dynamic simulation by the logical simulation device of the eighth embodiment like the logical simulation device of the seventh embodiment.

As described above in detail, according to the logical simulation device of the present invention, the logical simulation device is so constructed that delay values of circuit blocks in a target semiconductor integrated circuit can be calculated dynamically based on the values of test patterns during logical simulation. That is, the delay values of circuit blocks are not calculated before the logical simulation. It is therefore possible to eliminate the calculation for unnecessary delay values, and the delay values to be used only during the logical simulation operation may be calculated. As a result, it is possible to reduce the calculation time length of the logical simulation and possible to decrease the number of calculation data items to be stored.

In addition, the logical simulation device of the present invention is so constructed that timing check values are calculated by using the delay values that are calculated during the logical simulation. Therefore it is possible to calculate the timing check values accurately.

Furthermore, the logical simulation device of the present invention is so constructed that temperature coefficients corresponding to operational states of target circuits during the logical simulation are extracted, and the delay values and the timing check values are calculated in consideration of those extracted temperature coefficients. Therefore it is possible to calculate delay values and timing check values accurately.

While the above provides a full and complete disclosure of the preferred embodiments of the present invention, various modifications, alternate constructions and equivalents may be employed without departing from the scope of the invention. Therefore the above description and illustration should not be construed as limiting the scope of the invention, which is defined by the appended claims.

What is claimed is:

1. A logic circuit simulation device comprising:
    a delay value calculation section for reading
        logic circuit information including delay characteristic factors between logic circuit blocks in a semiconductor integrated circuit being simulated,
        input test patterns including descriptions of circuit verification operations of the logic circuit blocks, and
        delay value calculation information stored in a delay value and timing check value calculation library,
    the delay value calculation section calculating delay values of the logic circuit blocks based on the logic circuit information, the delay value calculation information, and the input test patterns, delay values being calculated only for conditional passes producing changes of events in response to the input test patterns rather than all possible changes of events, and storing the delay values in the delay value and timing check value calculation library; and
    a logic simulation section for simulating performance of the logic circuit using the delay values calculated by the delay value calculation section.

2. A logic circuit simulation device comprising:
    a delay value calculation section for reading
        logic circuit information including delay characteristic factors between logic circuit blocks in a semiconductor integrated circuit being simulated,
        input test patterns including descriptions of circuit verification operations of the logic circuit blocks, and
        delay value calculation information stored in a delay value and timing check value calculation library,
    the delay value calculation section calculating delay values of the logic circuit blocks based on the logic circuit information, the delay value calculation information, and the test input patterns;
    a timing check value calculation section calculating timing check values based on the delay values calculated by the delay value calculation section and timing check value calculation information read from the delay value and timing check value calculation library, the timing check value calculation section calculating conditional timing check values for the logic circuit block only for changes of events produced in response to the input test patterns rather than all possible changes of events that may be produced by the logic circuit blocks; and
    a logic simulation section for simulating performance of the logic circuit using the delay values calculated by the delay value calculation section.

3. The logic circuit simulation device as claimed in claim 2, wherein the timing check value calculation section calculates the timing check values of the logic circuit blocks based on an input through rate obtained using differences of delay values among passes in each of the logic circuit blocks.

4. A logic circuit simulation device comprising:
    a delay value calculation section for reading
        logic circuit information including delay characteristic factors between logic circuit blocks in a semiconductor integrated circuit being simulated, input test patterns including descriptions of circuit verification operations of the logic circuit blocks, and delay value calculation information stored in a delay value and timing check value calculation library, the delay value calculation section calculating delay values of the logic circuit blocks based on the logic circuit information, the delay value calculation information, and the test input patterns;

a temperature coefficient extracting section for extracting temperature coefficients corresponding to operation states of the logic circuit blocks and for providing the temperature coefficients to the delay value calculation section, wherein the delay value calculation section calculates the delay values in the logic circuit blocks based on the temperature coefficient coefficients; and a logic simulation section for simulating performance of the logic circuit using the delay values calculated by the delay value calculation section.

5. The logic circuit simulation device as claimed in claim 4, comprising a timing check value calculation section for calculating timing check values based on the delay values and timing check value calculation information read from the delay value and timing check value calculation library, wherein the temperature coefficient extracting section extracts the temperature coefficients corresponding to the operation states of the logic circuit blocks and provides the temperature coefficients to the timing check value calculation section, and the timing check value calculation section calculates the timing check values of the logic circuit blocks based on the temperature coefficients provided by the temperature coefficient extracting section.

6. The logic circuit simulation device as claimed in claim 4, comprising a circuit state/temperature coefficient table for storing temperature coefficients optionally set for the logical circuit blocks and process set values, wherein the temperature coefficient extracting section extracts the temperature coefficients corresponding to the logic circuit blocks from the circuit state/temperature coefficient table to preferentially use the temperature coefficients.

7. The logic circuit simulation device as claimed in claim 5, comprising a circuit state/temperature coefficient table for storing temperature coefficients optionally set for the logic circuit blocks and process set values, wherein the temperature coefficient extracting section extracts the temperature coefficients corresponding to the logic circuit blocks from the circuit state/temperature coefficient table to preferentially use the temperature coefficients.

8. The logic circuit simulation device as claimed in claim 4, wherein the temperature coefficient extracting section extracts the temperature coefficients corresponding to the operation states of the logic circuit blocks and provides the temperature coefficients to the delay value calculation section, and the delay value calculation section calculates delay values of the logic circuit blocks based on the temperature coefficients.

9. The logic circuit simulation device as claimed in claim 6, wherein the temperature coefficients are used in the logic simulation before the temperature coefficients are stored in the circuit state/temperature coefficient table.

10. The logic circuit simulation device as claimed in claim 7, wherein the temperature coefficients are used in the logic simulation before the temperature coefficients are stored in the circuit state/temperature coefficient table.

* * * * *